US009378676B2

(12) United States Patent
Nomura

(10) Patent No.: US 9,378,676 B2
(45) Date of Patent: Jun. 28, 2016

(54) DISPLAY DEVICE AND ELECTRONIC APPARATUS

(71) Applicant: SEIKO EPSON CORPORATION, Tokyo (JP)

(72) Inventor: Takeshi Nomura, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 76 days.

(21) Appl. No.: 14/322,408

(22) Filed: Jul. 2, 2014

(65) Prior Publication Data

US 2015/0009105 A1    Jan. 8, 2015

(30) Foreign Application Priority Data

Jul. 2, 2013   (JP) .................................. 2013-138659

(51) Int. Cl.
*G09G 3/32*   (2016.01)
*G09G 3/00*   (2006.01)
*H01L 27/32*  (2006.01)

(52) U.S. Cl.
CPC .............. *G09G 3/3233* (2013.01); *G09G 3/006* (2013.01); *G09G 2300/0426* (2013.01); *G09G 2300/0819* (2013.01); *G09G 2300/0861* (2013.01); *G09G 2310/0248* (2013.01); *G09G 2320/0209* (2013.01); *G09G 2320/0219* (2013.01); *G09G 2320/0295* (2013.01); *H01L 27/3262* (2013.01)

(58) Field of Classification Search
CPC ... G09G 3/3225; G09G 3/3233; G09G 3/006; G09G 2310/0248; G09G 2300/0819; G09G 2300/0861; G09G 2300/0426; G09G 2320/0219; G09G 2320/0209; H01L 27/3262
See application file for complete search history.

(56) References Cited

U.S. PATENT DOCUMENTS

| 5,668,381 | A | * | 9/1997 | Bae ..................... G02F 1/13454 257/66 |
| 5,790,213 | A | * | 8/1998 | Sasaki ................... G02F 1/1368 349/48 |
| 2003/0205968 | A1 | | 11/2003 | Chae et al. |
| 2005/0007357 | A1 | * | 1/2005 | Yamashita ........... G09G 3/3233 345/204 |
| 2005/0264498 | A1 | | 12/2005 | Asano |
| 2006/0017393 | A1 | | 1/2006 | Kang et al. |
| 2007/0010039 | A1 | | 1/2007 | Chae et al. |
| 2009/0102760 | A1 | | 4/2009 | Yamashita et al. |

(Continued)

FOREIGN PATENT DOCUMENTS

| JP | A-2004-006341 | 1/2004 |
| JP | A-2005-338591 | 12/2005 |

(Continued)

*Primary Examiner* — Ilana Spar
*Assistant Examiner* — Mihir Rayan
(74) *Attorney, Agent, or Firm* — Oliff PLC

(57) ABSTRACT

Provided is an active matrix display device using an organic EL panel including: a plurality of pixel circuits each including an organic light emitting diode arranged in a pixel region of the organic EL panel and a plurality of transistors configured to drive the organic light emitting diode; a plurality of scanning lines arranged along a first direction in the organic EL panel; and a plurality of data lines arranged along a second direction that is orthogonal to the first direction. In at least one set of pixel circuits that are adjacent in the first direction, gate electrodes and impurity diffusion regions of the plurality of transistors have an axisymmetric layout. Gate electrodes of at least one set of transistors that are symmetrically arranged in the at least one set of pixel circuits are integrated.

15 Claims, 6 Drawing Sheets

(56) References Cited

U.S. PATENT DOCUMENTS

| | | | |
|---|---|---|---|
| 2009/0103036 A1* | 4/2009 | Onodera | H01L 27/12 349/144 |
| 2009/0189850 A1* | 7/2009 | Murayama | G09G 3/344 344/107 |
| 2009/0295773 A1* | 12/2009 | Taneda | G09G 3/3233 345/211 |
| 2010/0231615 A1 | 9/2010 | Tokuda et al. | |
| 2010/0270678 A1 | 10/2010 | Ikeda et al. | |
| 2011/0032238 A1 | 2/2011 | Asano | |
| 2011/0242039 A1* | 10/2011 | Kalis | G06F 1/1643 345/174 |
| 2012/0105412 A1* | 5/2012 | Kang | G09G 3/3233 345/211 |
| 2012/0273900 A1* | 11/2012 | Tokumitsu | H01L 21/823418 257/402 |
| 2013/0076720 A1* | 3/2013 | Al-Dahle | G02F 1/136286 345/212 |

FOREIGN PATENT DOCUMENTS

| | | |
|---|---|---|
| JP | A-2008-299352 | 12/2008 |
| JP | A-2009-288467 | 12/2009 |
| JP | A-2010-015185 | 1/2010 |
| JP | A-2010-117724 | 5/2010 |
| JP | A-2010-210905 | 9/2010 |
| JP | A-2010-272845 | 12/2010 |

\* cited by examiner

DISPLAY DEVICE AND ELECTRONIC APPARATUS

CROSS REFERENCE

The entire disclosure of Japanese Patent Application No. 2013-138659 filed Jul. 2, 2013 is expressly incorporated by reference herein.

BACKGROUND

1. Technical Field

The present invention relates to an active matrix display device using an organic EL (ElectroLuminescence: electroluminescence) panel. The invention further relates to an electronic apparatus, etc., using such a display device.

2. Related Art

An organic EL panel is configured by arranging organic light emitting diodes (Organic Light-Emitting Diode: OLED) having a light emitting layer made of an organic compound in a plurality of pixels. Such an organic light emitting diode emits light when molecules of the organic compound, which have been excited by energy generated by recombination of electrons and holes that are injected into the light emitting layer, return from the excited state to the ground state. In the organic EL panel, application of a current between the anode (positive electrode) and the cathode (negative electrode) of the light emitting diode causes impulse lighting at a brightness corresponding to the current value.

Examples of a method for driving the organic EL panel include the passive matrix type and the active matrix type. According to the passive matrix type, organic light emitting diodes of the respective pixels are connected between a plurality of lines of an anode driver and a plurality of lines of a cathode driver. Although its structure is simple as described above, light is emitted on a line by line basis and therefore brightness of the light emission is required to be high, which leads to problems of short life span of elements and degradation of image quality due to crosstalk.

On the other hand, according to the active matrix type, a plurality of transistors are arranged in each pixel, and high light emission efficiency and high image quality are feasible by applying a current to organic light emitting diodes during a predetermined period. However, use of TFTs (thin film transistors) made of amorphous silicon as the transistors of pixel circuits causes an increase in age-related change, while use of TFTs made of low temperature polycrystal silicon causes an increase in variation in threshold voltage in the pixels. In either case, a complex structure of pixel circuits is needed in order to compensate for such problems.

SUMMARY

In the state of the art of active matrix display devices, the layout of pixel circuits is a repetition of the same pattern in order to balance the influence of the arrangement of transistors and lines on image quality, or the layout of pixel circuits is a mirror arrangement that is symmetrical on the left and right sides and/or the top and bottom sides in order to reduce the size of pixel circuits.

JP-A-2010-210905 (see paragraphs 0007 to 0009) is an example of related art. It is conceivable to provide an image display device that allows efficient arrangement of pixel circuits in a display region. This image display device is configured to display an image by causing light emission of light emitting elements, which are arranged respectively in a plurality of pixel regions formed by dividing the display region into a grid pattern. In the image display device, pixel circuits that control the light emission of the light emitting elements are arranged respectively in the plurality of pixel regions. Each pixel circuit is formed in a region including a portion where the pixel circuit projects from its pixel region toward an adjacent pixel region and a portion where the adjacent pixel circuit projects into the pixel region.

JP-A-2004-006341 (see paragraphs 0039 to 0041) is an example of related art. It is conceivable to provide an organic electric field light emitting element having an improved aperture ratio. This organic electric field light emitting element includes a substrate, a plurality of gate lines in an upper part of the substrate, a plurality of data lines in an upper part of the substrate which mutually intersect the plurality of gate lines, a plurality of switching elements and driving elements which are formed in an upper part of the substrate and are mutually connected, and power source lines which are formed in an upper part of the substrate in parallel to the plurality of data lines and are electrically connected to at least two of the driving elements. Such a configuration can reduce the number of power source lines by half, and therefore the aperture ratio is improved as compared to the state of the art. Thus, there is no need to increase the current level, which can extend the life span of elements.

In JP-A-2010-210905, the layout of pixel circuits is a mirror arrangement that is symmetrical on the left and right sides and/or the top and bottom sides, in which, however, a data signal line formed at an end of a pixel circuit (see DAT in FIG. 1 and FIG. 3C) is adjacent to a data signal line of the next pixel circuit. In JP-A-2004-006341, the layout of pixel circuits is a mirror arrangement that is symmetrical on the left and right sides, in which however, a data line formed at an end of a pixel circuit (see 111 in FIG. 5) is adjacent to a data line of the next pixel circuit.

In an active matrix display device using an organic EL panel, a transistor that passes a current to an organic light emitting diode is capacitively driven by a pixel signal (electric charge) written in a capacitor of a pixel circuit via a data line. At this time, if two data lines are adjacent to each other, a pixel signal that has been once written in a capacitor of a pixel circuit may be changed when a pixel signal is written into a capacitor of the next pixel circuit, due to the parasitic capacitance between the two adjacent data lines, which may possibly affect the tone.

As described above, in the active matrix display device using an organic EL panel, a plurality of transistors are arranged in each pixel circuit, and thus it is difficult to reduce the size of pixel circuits. Therefore, there are production constraints in reducing the pixel pitch for displaying high-definition images. Further, in the case where the layout of pixel circuits is a mirror arrangement that is symmetrical on the left and right sides, there is also a problem of crosstalk due to the parasitic capacitance between two adjacent data lines. Therefore, an advantage of some aspects of the invention is to provide a display device capable of easily reducing the size of pixel circuits. Another advantage of some aspects of the invention is to reduce crosstalk due to the parasitic capacitance between data lines in two adjacent pixel circuits.

In order to solve the aforementioned problems, a display device according to an aspect of the invention, which is an active matrix display device using an organic EL (electroluminescence) panel, includes: a plurality of pixel circuits each including an organic light emitting diode arranged in a pixel region of the organic EL panel and a plurality of transistors configured to drive the organic light emitting diode; a plurality of scanning lines arranged along a first direction in the organic EL panel; and a plurality of data lines arranged along a second direction that is orthogonal to the first direction in the organic EL panel. In at least one set of pixel circuits that are adjacent in the first direction, gate electrodes and impurity diffusion regions of the plurality of transistors have an axisymmetric layout, and gate electrodes of at least one set of transistors that are symmetrically arranged in the at least one set of pixel circuits are integrated.

According to an aspect of the invention, gate electrodes and impurity diffusion regions of a plurality of transistors in at least one set of pixel circuits that are adjacent in the first direction have an axisymmetric layout, thereby allowing lines to be efficiently arranged in an interconnect layer. Further, gate electrodes of at least one set of transistors that are symmetrically arranged in the at least one set of pixel circuits that are adjacent in the first direction are shared and integrated, thereby narrowing the distance between the transistors, as compared to the case where the gate electrodes of the transistors are individually formed, by the amount of a space to be provided between the gate electrodes in the aforementioned case. Thus, it is possible to reduce the pixel pitch.

This display device may further include a shielding line arranged between two data lines connected respectively to one set of pixel circuits that are adjacent in the first direction. This makes it possible to prevent the two data lines from being adjacent to each other so as to reduce crosstalk due to the parasitic capacitance between the data lines, even if the layout of one set of pixel circuits that are adjacent in the first direction is a mirror arrangement.

Further, the plurality of pixel circuits may each include: a first transistor configured to supply a current to the organic light emitting diode in accordance with a potential of a capacitor connected to its gate; and a second transistor configured to connect the gate of the first transistor to a single data line in accordance with a potential of a scanning line connected to its gate. In this way, even in the case where only two transistors are included in a pixel circuit, it is possible to display an image on the organic EL panel.

Here, gate electrodes of second transistors of one set of pixel circuits that are adjacent in the first direction may be integrated. This can reduce the distance between second transistors of one set of pixel circuits.

Further, the plurality of pixel circuits may each further include: a third transistor configured to open and close connection between the gate and drain of the first transistor in accordance with a signal supplied to its gate; a fourth transistor configured to open and close connection between the drain of the first transistor and the anode of the organic light emitting diode in accordance with a signal supplied to its gate; and a fifth transistor configured to open and close connection between the anode of the organic light emitting diode and a reset potential line in accordance with a signal supplied to its gate. This can further improve image quality and functions.

In that case, it is possible to employ a configuration in which, in first to third pixel circuits that are adjacent in the first direction, gate electrodes of second transistors of the second and third pixel circuits are integrated, gate electrodes of third transistors of the second and third pixel circuits are integrated, gate electrodes of fourth transistors of the first and second pixel circuits are integrated, and gate electrodes of fifth transistors of the second and third pixel circuits are integrated. This can reduce the distance between one set of second transistors, the distance between one set of third transistors, the distance between one set of fourth transistors, and the distance between one set of fifth transistors.

Further, this display device may further include a shielding line arranged between two lines connected respectively to gate electrodes of first transistors of one set of pixel circuits that are adjacent in the first direction. A shielding effect increases due to the shielding line being arranged in such a layout pattern. Therefore, it is possible to reduce the influence of crosstalk between adjacent pixels on display.

In the configurations described above, the integrated gate electrodes of the at least one set of transistors that are symmetrically arranged in the at least one set of pixel circuits that are adjacent in the first direction may be connected to a single line at one connection point. This can reduce the number of through holes and contacts, so as to reduce the size of pixel circuits.

An electronic apparatus according to an aspect of the invention includes the display device according to any one of aspects of the invention. Thus, it is possible to provide an electronic apparatus such as an electronic viewfinder and a head mounted display having a reduced pixel pitch for displaying high-definition images.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
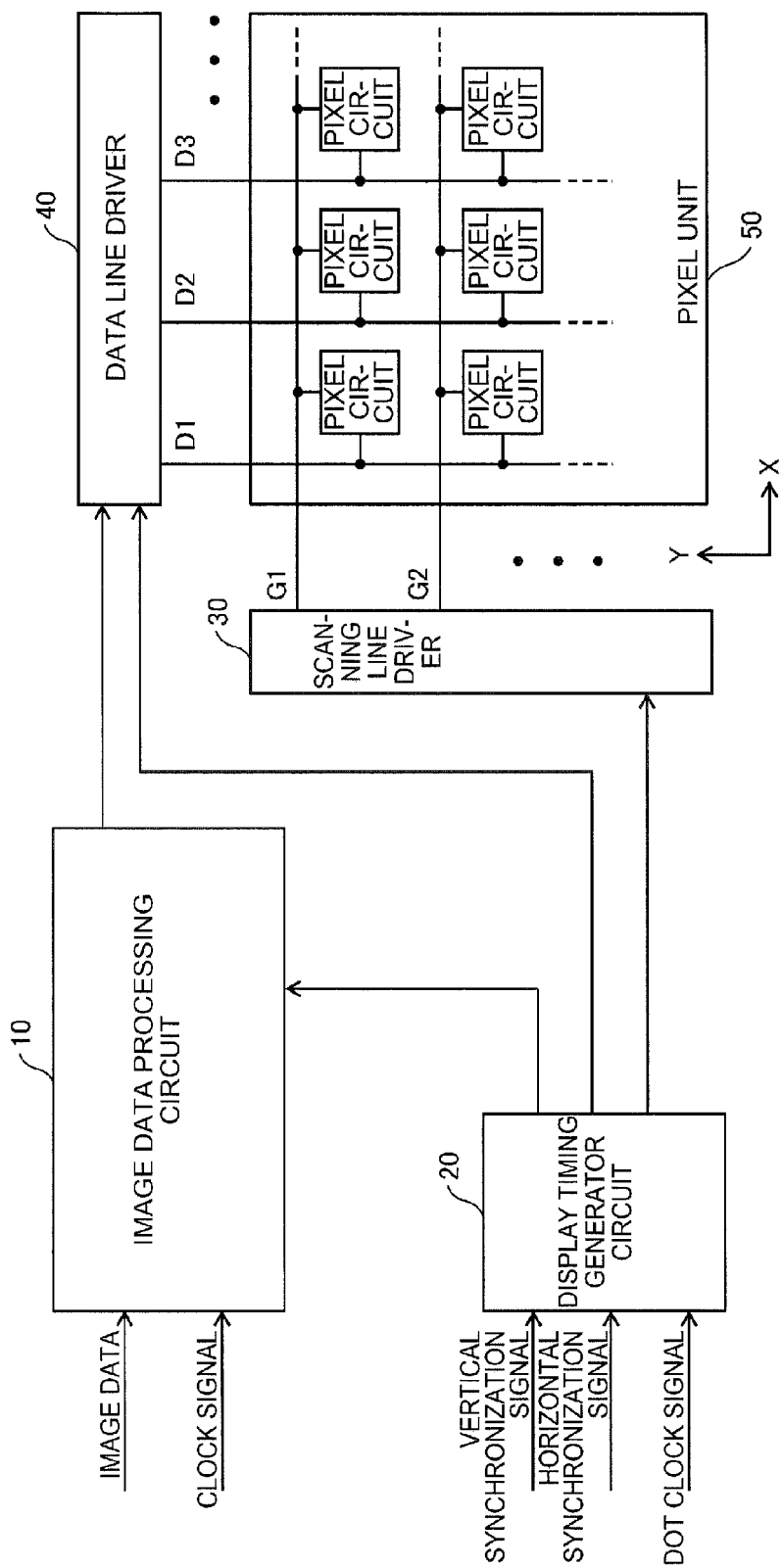
FIG. 1 is a block diagram showing an electronic apparatus using a display device according to an embodiment of the invention.

Hereinafter, embodiments of the invention are described in detail with reference to the drawings. It should be noted that the same components are denoted by the same reference numerals, and the description thereof is omitted.

FIG. 1 is a block diagram showing a configuration of an electronic apparatus using a display device according to an embodiment of the invention. This electronic apparatus is an electronic apparatus such as an electronic viewfinder and a head mounted display. FIG. 1 shows only portions associated with image display.

As shown in FIG. 1, the electronic apparatus includes an image data processing circuit 10, a display timing generator circuit 20, a scanning line driver 30, a data line driver 40, and a pixel unit 50. Here, an active matrix display device using an organic EL panel is constituted by components including at least the scanning line driver 30 to the pixel unit 50.

The pixel unit 50 includes a plurality of pixel circuits formed respectively in a plurality of pixel regions of the organic EL panel. In such an organic EL panel, pixel circuits may be formed by forming TFTs on a transparent substrate using amorphous silicon or low temperature polycrystal silicon. Alternatively, an organic EL panel formed by using a silicon (Si) semiconductor substrate on which pixel circuits are formed as a backplane, and forming organic light emitting diodes (OLEDs) further thereon may be used. Such an organic EL panel is referred to also as "SiOLED".

In the case of SiOLED, even if the number of transistors that constitute each pixel circuit increases, such transistors can be formed on a semiconductor substrate easily. Further, not only components of the scanning line driver 30 to the pixel unit 50, but also at least part of the image data processing circuit 10 and the display timing generator circuit 20 may be formed on the semiconductor substrate.

The image data processing circuit 10 inputs image data and clock signals, and applies various types of image processing to the image data. For example, the image data processing circuit 10 may apply gamma correction or afterimage correction to the image data. The image data processing circuit 10 supplies the image data subjected to such image processing to the data line driver 40.

The display timing generator circuit 20 generates various timing signals for controlling the display device in synchronization with a vertical synchronization signal, a horizontal synchronization signal, and a dot clock signal that are supplied from the outside. For example, the display timing generator circuit 20 generates a start signal and a line clock signal, and supplies them to the scanning line driver 30. The start signal contains a start pulse that determines the start timing of vertical scanning, and serves as a trigger to start scanning the pixel unit 50.

The scanning line driver 30 includes a shift register and an output buffer, and is configured to sequentially select a plurality of scanning lines G1, G2, etc., upon application of the start pulse in synchronization with the line clock signal, so as to supply a scanning signal to the selected scanning line. In this way, the start pulse serves as a trigger, and all the scanning lines are sequentially selected. Thus, one vertical scanning drive is completed. Further, the scanning line driver 30 may supply various control signals for controlling the operation of the pixel unit 50 to the pixel unit 50.

The data line driver 40 includes a plurality of D/A converters, and is configured to generate a plurality of pixel signals corresponding to tones to be expressed by the image data supplied from the image data processing circuit 10. The data line driver 40 supplies those pixel signals to a plurality of data lines D1, D2, etc., at a timing in synchronization with the scanning signal.

In the pixel unit 50, the plurality of scanning lines G1, G2, etc., are arranged along a first direction (X axis direction in the figure) of the organic EL panel, and the plurality of data lines D1, D2, etc., are arranged along a second direction (Y axis direction in the figure) of the organic EL panel that is orthogonal to the first direction. Further, the plurality of pixel circuits are provided at positions where those scanning lines intersect those data lines.

In accordance with the scanning signal supplied from the scanning line driver 30, a plurality of rows of pixel circuits are sequentially selected. Pixel signals supplied from the data line driver 40 are respectively written into the selected pixel circuits in one row via the plurality of data lines D1, D2, etc. The pixel circuits include their respective organic light emitting diodes, and the organic light emitting diodes emit light at an intensity corresponding to the written pixel signals, so that tones are displayed on a pixel-by-pixel basis.

Figure 2:
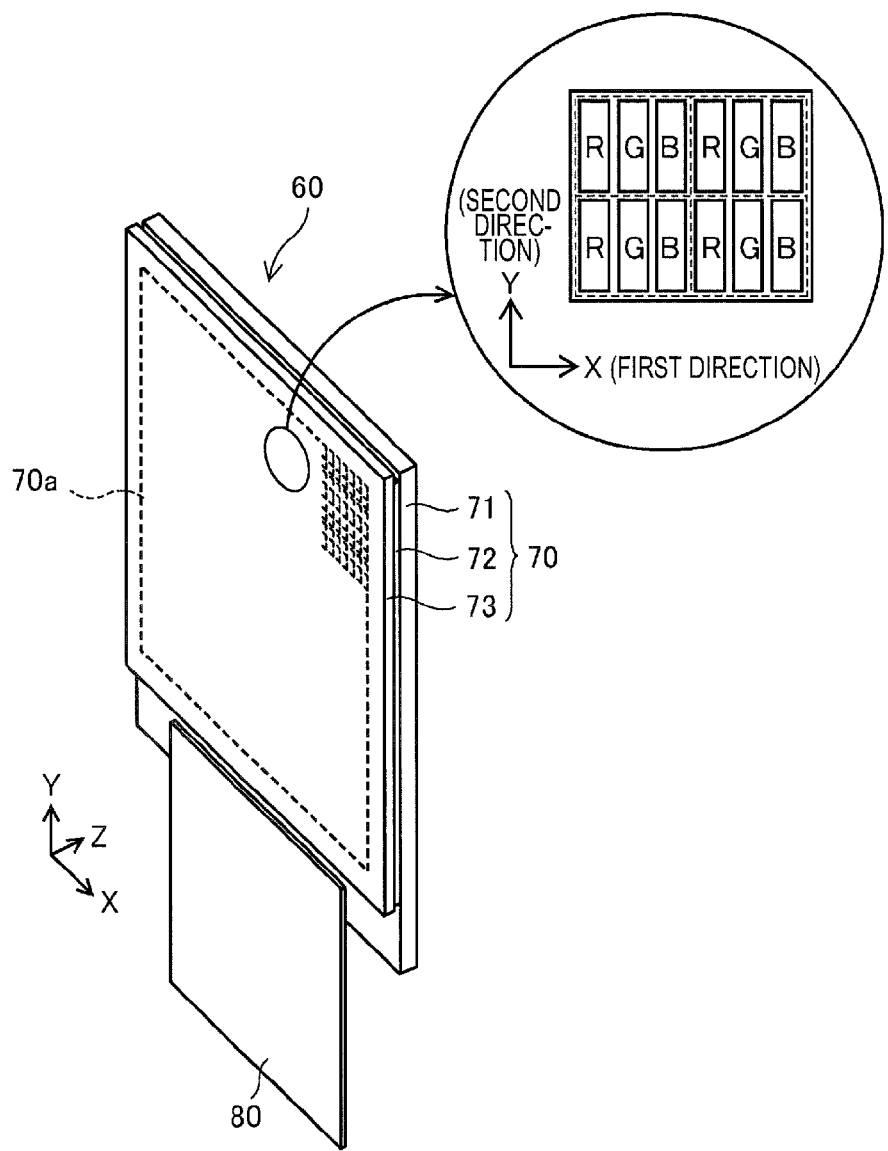
FIG. 2 is a perspective view showing an example of a display device according to an embodiment of the invention.

FIG. 2 is a perspective view showing an example of a display device according to an embodiment of the invention. A display device using a SiOLED is described herein. As shown in FIG. 2, a display device 60 includes an organic EL panel 70 and a flexible substrate 80. The organic EL panel 70 is a display panel of a top emission type that includes a silicon semiconductor substrate 71, a light emitting layer (OLED layer) 72 composed of an organic compound deposited on the semiconductor substrate 71, and a cover glass 73 provided on the OLED layer 72. A plurality of pixel circuits are formed on the semiconductor substrate 71, and display light emitted by the OLED layer 72 is output from the cover glass 73 side.

The organic EL panel 70 includes a display region 70a having a plurality of pixels arranged in the form of a matrix. As shown as an enlarged view in the upper right of FIG. 2, light emitting elements of red (R), green (G), and blue (B) are periodically arranged in the display region 70a, so that full color images are displayed using light output by the light emitting elements.

The scanning line driver 30 and the data line driver 40 (see FIG. 1) are formed in a peripheral edge (frame portion) of the display region 70a of the organic EL panel 70. Circuit elements that constitute these circuits are formed on the semiconductor substrate 71, similarly to pixel circuits. Further, the flexible substrate 80 is connected to a region where the semiconductor substrate 71 projects over the cover glass 73.

A plurality of terminals for connection to an external device or dedicated controller are formed at an end of the flexible substrate 80. The organic EL panel 70 displays images, characters, etc., on the display region 70a by receiving a supply of image data, power, or control signals from such an external device or controller via the flexible substrate 80.

Figure 3:
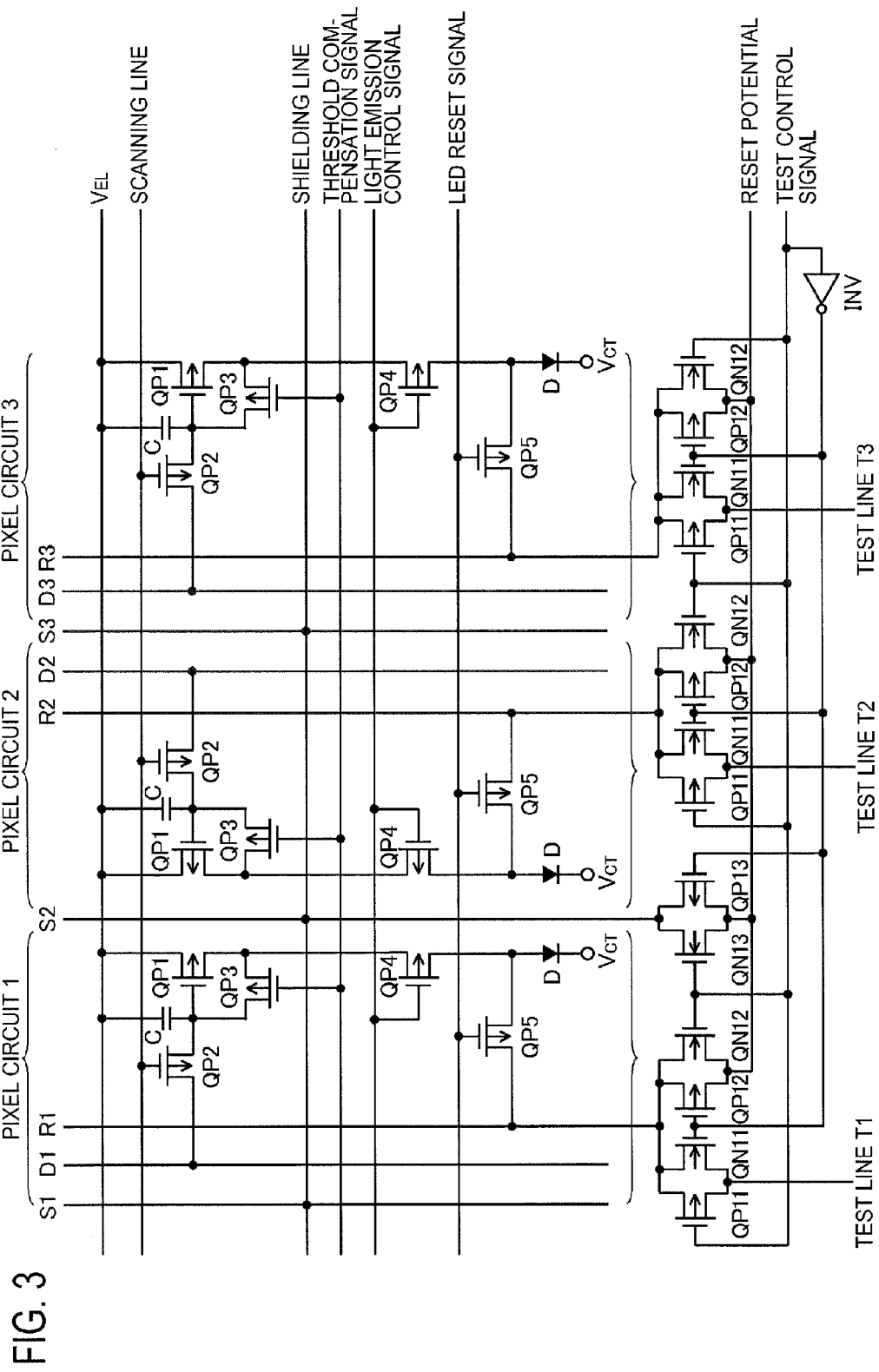
FIG. 3 is a circuit diagram showing an example of a circuit configuration of a pixel unit shown in FIG. 1.

FIG. 3 is a circuit diagram showing an example of a circuit configuration of the pixel unit shown in FIG. 1. FIG. 3 shows three pixel circuits 1 to 3 that are adjacent in the first direction (X axis direction shown in FIG. 1) and circuits for test control. The pixel circuits 1 to 3 are respectively provided, for example, in three pixel regions in which RGB light emitting elements are formed. A power potential VEL (for example, 8 V) and a power potential VCT (for example, 0 V) are supplied to the pixel circuits 1 to 3.

The pixel circuit 1 includes an organic light emitting diode D arranged in a pixel region of the organic EL panel, a plurality of transistors that drive the organic light emitting diode D, and a capacitor C that stores a pixel signal. The pixel circuit, for example, includes P-channel MOS transistors QP1 and QP2, and may optionally further include P-channel MOS transistors QP3 to QP5.

The source of the transistor QP1 is connected to the power potential VEL, and the drain of the transistor QP1 is connected to the source of the transistor QP4. In the case where the transistor QP4 is not provided, the drain of the transistor QP1 is connected to the anode of the organic light emitting diode D. The cathode of the organic light emitting diode D is connected to the power potential VCT. Further, the first electrode of the capacitor C is connected to the power potential VEL, and the second electrode of the capacitor C is connected to the gate of the transistor QP1.

The source of the transistor QP2 is connected to the data line D1, and the drain of the transistor QP2 is connected to the second electrode of the capacitor C and the gate of the transistor QP1. Further, the gate of the transistor QP2 is connected to a single scanning line, the transistor QP2 connects the gate of the transistor QP1 to the data line D1 in accordance with the potential of the scanning line connected to its gate.

That is, when the potential of the scanning line is activated to a low level, the transistor QP2 is turned on and supplies the potential of the data line D1 to the gate of the transistor QP1. The transistor QP1 supplies a current to the organic light emitting diode D in accordance with the potential stored in the second electrode of the capacitor C connected to its gate. The organic light emitting diode D emits light at a brightness corresponding to the thus supplied current value.

On the other hand, when the potential of the scanning line is deactivated to a high level, the transistor QP2 is turned off and the gate of the transistor QP1 is disconnected from the data line D1. Nevertheless, also in this state, the transistor QP1 can supply a current to the organic light emitting diode D in accordance with the potential stored in the second electrode of the capacitor C connected to the gate.

In this way, even in the case where the pixel circuit 1 includes only two transistors QP1 and QP2, it is possible to display an image on the organic EL panel. However, a description is given below for the case where the pixel circuit 1 further includes P-channel transistors QP3 to QP5 in order to further improve image quality and functions.

The source of the transistor QP3 is connected to the gate of the transistor QP1, and the drain of the transistor QP3 is connected to the drain of the transistor QP1. Further, a threshold compensation signal is supplied to the gate of the transistor QP3, so that the transistor QP3 opens and closes the connection between the gate and the drain of the transistor QP1 in accordance with the threshold compensation signal.

That is, when the threshold compensation signal is activated to a low level, the transistor QP3 is turned on and connects the gate and the drain of the transistor QP1, which makes the transistor QP1 equivalent to a diode. At this time, the potential of the data line D1 is fixed to a predetermined potential (for example, 0 V) and the transistor QP2 is turned on, thereby generating a forward voltage at both ends of the equivalent diode, which is stored in the capacitor C.

Accordingly, even if variation in threshold voltage of transistors QP1 occurs in a plurality of pixel circuits, a voltage corresponding to the threshold voltage is stored in the capacitor C, which enables compensation for variation in drain current due to the variation in threshold voltage of transistors QP1. Thereafter, in a state where the threshold compensation signal is deactivated to a high level and the transistor QP3 is turned off, a pixel signal is supplied to the data line D1, so that the potential of the pixel signal is superimposed on the potential stored in the second electrode of the capacitor C.

The source of the transistor QP4 is connected to the drain of the transistor QP1, and the drain of the transistor QP4 is connected to the anode of the organic light emitting diode D. A light emission control signal is supplied to the gate of the transistor QP4, and the transistor QP4 opens and closes the connection between the drain of the transistor QP1 and the anode of the organic light emitting diode D in accordance with the light emission control signal.

That is, when the light emission control signal is activated to a low level, the transistor QP4 is turned on and a drain current of the transistor QP1 is supplied to the organic light emitting diode D. On the other hand, when the light emission control signal is deactivated to a high level, the transistor QP4 is turned off and supplying the drain current of the transistor QP1 to the organic light emitting diode D is stopped. In this way, it is possible to control the light emission period of the organic light emitting diode D corresponding to the period during which the light emission control signal is activated.

The source of the transistor QP5 is connected to a reset potential line R1, and the drain of the transistor QP5 is connected to the anode of the organic light emitting diode D. An LED reset signal is supplied to the gate of the transistor QP5, and the transistor QP5 opens and closes the connection between the anode of the organic light emitting diode D and the reset potential line R1 in accordance with the LED reset signal.

That is, when the LED reset signal is activated to a low level, the transistor QP5 is turned on and applies a predetermined reset potential (for example, 0 V) to the anode of the organic light emitting diode D. This can completely stop light emission of the organic light emitting diode D. On the other hand, when the LED reset signal is deactivated to a high level, the transistor QP5 is turned off and light emission of the organic light emitting diode D is enabled.

The reset potential line R1 can be used also for measuring a drain current of the transistor QP1 in a test mode. For this purpose, a first transmission gate composed of a P-channel MOS transistor QP11 and an N-channel MOS transistor QN11 is connected between the reset potential line R1 and a test line T1. Further, a second transmission gate composed of a P-channel MOS transistor QP12 and an N-channel MOS transistor QN12 is connected between the reset potential line R1 and the reset potential.

In the test mode, a test control signal is activated to a low level, and an output signal of an inverter INV is set to a high level. Accordingly, the transistors QP11 and QN11 of the first transmission gate are turned on, and the transistors QP12 and QN12 of the second transmission gate are turned off. Thus, the reset potential line R1 is connected to the test line T1. This makes it possible to measure a drain current of the transistor QP1 via the test line T1 when the transistor QP5 is on.

On the other hand, in a normal operation mode, the test control signal is deactivated to a high level, and the output signal of the inverter INV is set to a low level. Accordingly, the transistors QP11 and QN11 of the first transmission gate are turned off, and the transistors QP12 and QN12 of the second transmission gate are turned on. Thus, the reset potential line R1 is connected to the reset potential.

The configuration of the pixel circuit 1 is as described above, and the pixel circuits 2 and 3 also have the same configurations as the pixel circuit 1. In the figure, a shielding line S1 is provided on the left side of the pixel circuit 1, a shielding line S2 is provided between the pixel circuit 1 and the pixel circuit 2, and a shielding line S3 is provided between the pixel circuit 2 and the pixel circuit 3. Further, a transmission gate composed of a P-channel MOS transistor QP13 and an N-channel MOS transistor QN13 is connected between the reset potential and the shielding lines S1 to S3.

In the test mode, the transistors QP13 and QN13 of the transmission gate are turned off, and the shielding lines S1 to S3 are disconnected from the reset potential. On the other hand, in the normal operation mode, the transistors QP13 and QN13 of the transmission gate are turned on, and the shielding lines S1 to S3 are connected to the reset potential.

Next, a layout of pixel circuits shown in FIG. 3 is described. In the case of a SiOLED, a gate electrode is formed in a partial region of a silicon semiconductor substrate via a gate insulation film, and impurity diffusion regions that serve as a source and a drain are formed in the semiconductor substrate on both sides of the gate electrode. Thus, a transistor is formed.

A first interconnect layer is formed, via a first interlayer insulating film, on the semiconductor substrate on which transistors are formed, and a second interconnect layer is formed further thereon via a second interlayer insulating film. In this way, a required number of interconnect layers are formed. For example, interlayer insulating films are made of silicon dioxide, and interconnect layers are made of aluminum.

Figure 4:
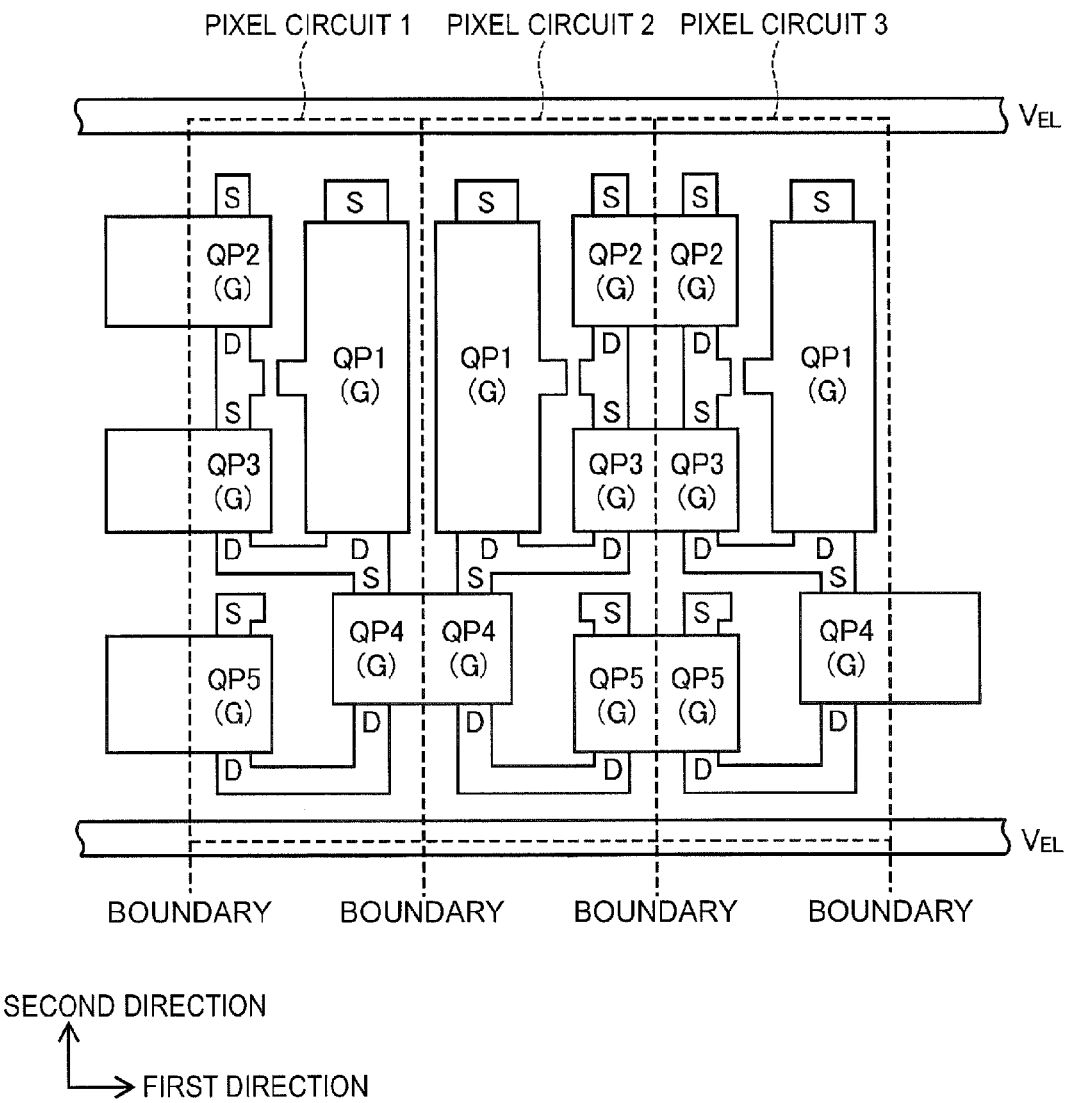
FIG. 4 is a plan view showing a layout of gate electrodes and impurity diffusion regions in pixel circuits.
Figure 5:
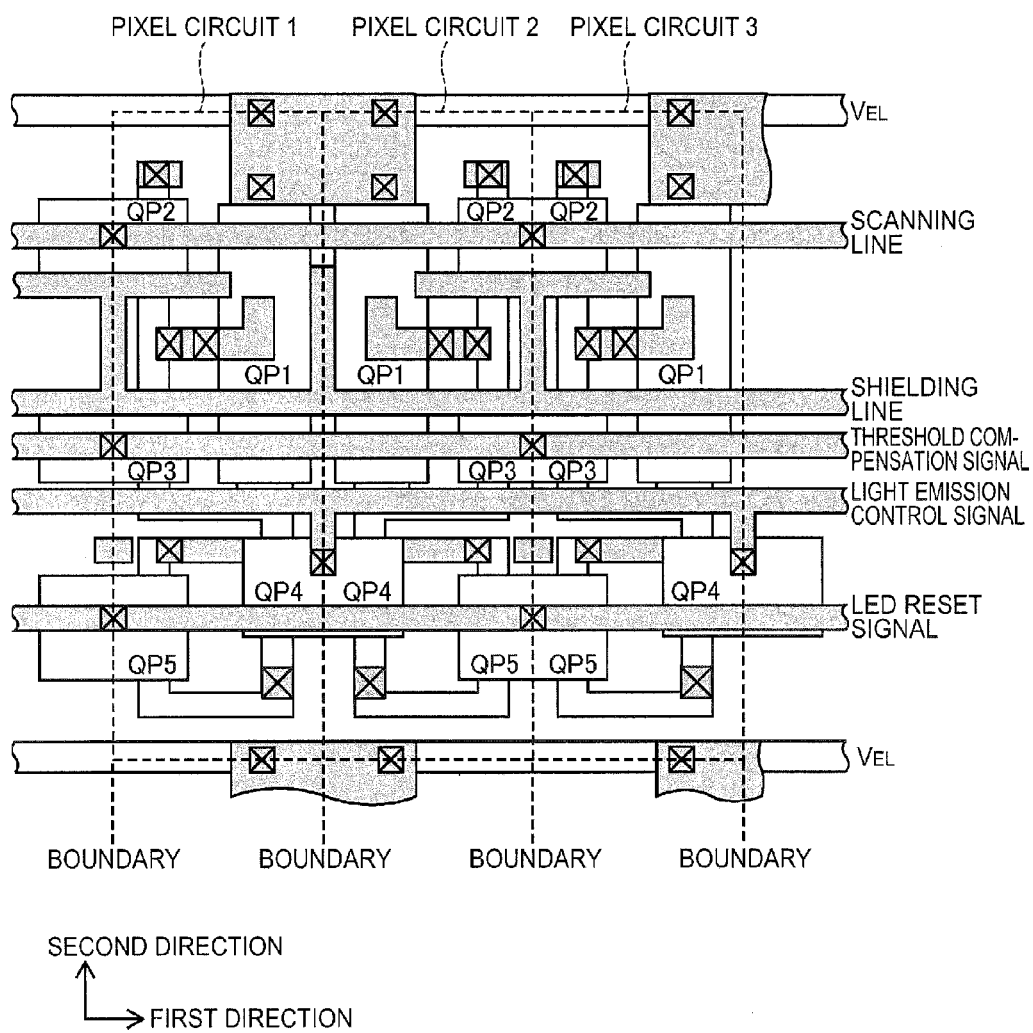
FIG. 5 is a plan view showing a layout of a first interconnect layer in pixel circuits.
Figure 6:
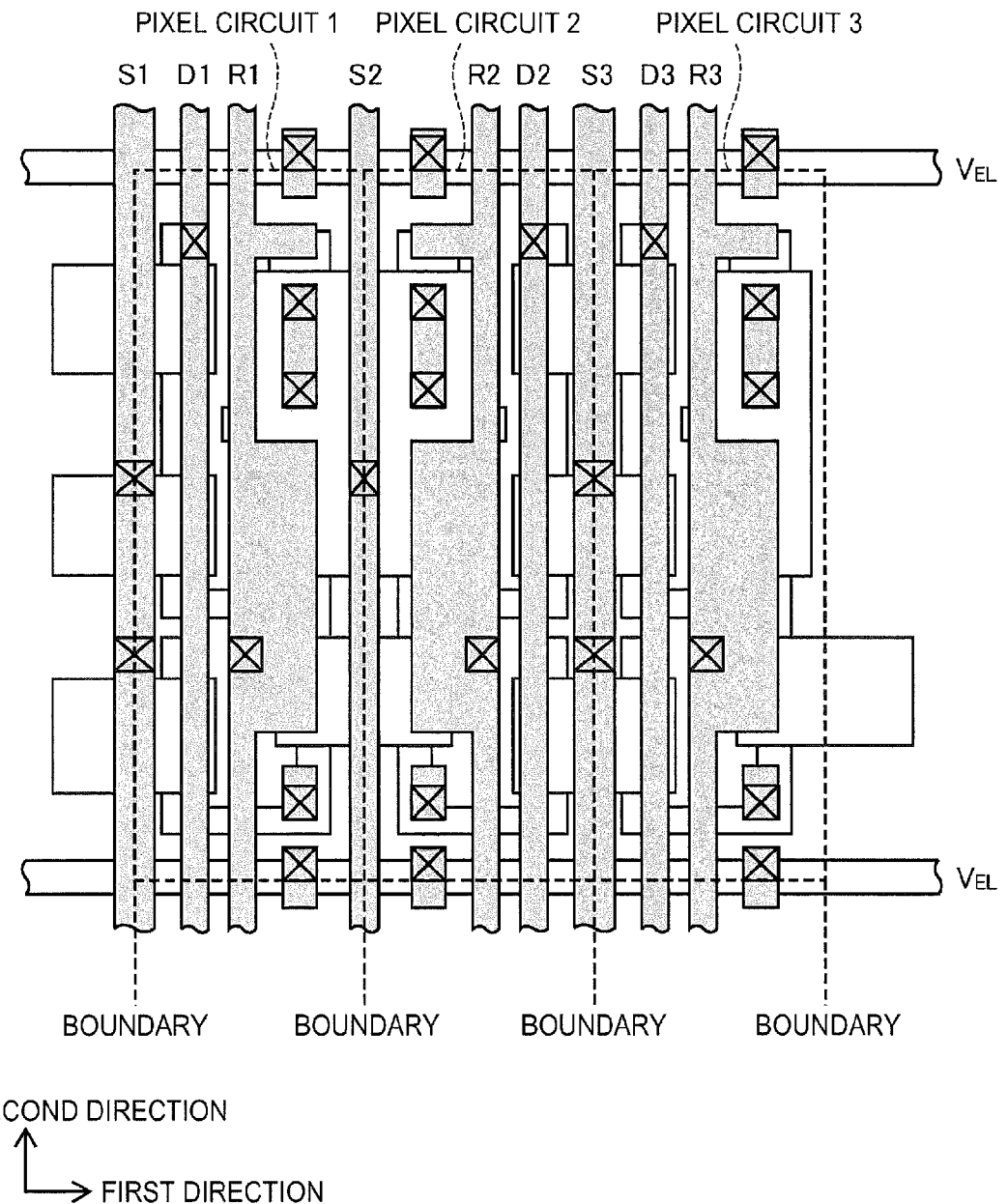
FIG. 6 is a plan view showing a layout of a second interconnect layer in pixel circuits.

FIG. 4 is a plan view showing a layout of gate electrodes and impurity diffusion regions in the pixel circuits shown in FIG. 3. FIG. 5 is a plan view showing a layout of a first interconnect layer in the pixel circuits shown in FIG. 3. FIG. 6 is a plan view showing a layout of a second interconnect layer in the pixel circuits shown in FIG. 3. In FIG. 5 and FIG. 6, layouts of the respective interconnect layers are shown in gray on the layout of gate electrodes and impurity diffusion regions. Further, a mark "x" indicates a through hole that is formed through interlayer insulating films for allowing a line in each interconnect layer to be connected to a lower layer.

In FIG. 4 to FIG. 6, three pixel circuits 1 to 3 that are adjacent in the first direction (X axis direction shown in FIG. 1) are shown. Also in other pixel circuits, a mirror arrangement is employed as a layout of one set of (two) pixel circuits that are adjacent in the first direction. One set of pixel circuits that are adjacent in the second direction (Y axis direction shown in FIG. 1) may be a repetition of the same pattern, or may be a mirror arrangement. It should be noted that the first direction and the second direction in a layout of pixel circuits are not limited to the X axis direction and the Y axis direction shown in FIG. 1.

As shown in FIG. 4, in the pixel circuits 1 and 2 that are adjacent in the first direction, gate electrodes (G), sources (S), and drains (D) of transistors QP1 to QP5 are laid out so as to be axisymmetric with respect to a boundary of the pixel circuits. Furthermore, gate electrodes of one set of transistors QP4 that are in a symmetrical arrangement are integrated.

Further, in the pixel circuits 2 and 3 that are adjacent in the first direction, gate electrodes (G), sources (S), and drains (D) of transistors QP1 to QP5 are laid out so as to be axisymmetric with respect to a boundary of the pixel circuits. Furthermore, gate electrodes of one set of transistors QP2 that are in a symmetrical arrangement are integrated, gate electrodes of one set of transistors QP3 that are in a symmetrical arrangement are integrated, and gate electrodes of one set of transistors QP5 that are in a symmetrical arrangement are integrated.

In this way, gate electrodes and impurity diffusion regions of a plurality of transistors in at least one set of pixel circuits that are adjacent in the first direction have an axisymmetric layout, thereby allowing lines to be efficiently arranged in an interconnect layer. Further, gate electrodes of at least one set of transistors that are symmetrically arranged in at least one set of pixel circuits that are adjacent in the first direction are shared and integrated, thereby narrowing the distance between the transistors, as compared to the case where the gate electrodes of those transistors are individually formed, by the amount of a space to be provided between the gate electrodes in the aforementioned case. Thus, it is possible to reduce the pixel pitch.

As shown in FIG. 5, the first interconnect layer has a scanning line, a shielding line, a threshold compensation signal line, a light emission control signal line, and an LED reset signal line that are formed along the first direction. In the pixel circuits 1 and 2, integrated gate electrodes of one set of transistors QP4 are connected to the light emission control signal line at one connection point. Further, in the pixel circuit 2 and the pixel circuit 3, integrated gate electrodes of one set of transistors QP2 are connected to a single scanning line at one connection point, integrated gate electrodes of one set of transistors QP3 are connected to the threshold compensation signal line at one connection point, and integrated gate electrodes of one set of transistors QP5 are connected to the LED reset signal line at one connection point.

In this way, integrated gate electrodes of one set of transistors that are symmetrically arranged in one set of pixel circuits that are adjacent in the first direction are connected to a single line at one connection point, thereby reducing the number of through holes and contacts. Thus, it is possible to reduce the size of pixel circuits.

Further, the shielding line is arranged not only between the scanning line and the threshold compensation signal line but also between the scanning line and a line connected to the gate electrode of the transistor QP1 in each of the pixel circuits 1 to 3. Furthermore, the shielding line is arranged also between two lines connected respectively to one set of transistors QP1 that are symmetrically arranged in one set of adjacent pixel circuits. Arranging the shielding line in such a layout pattern leads to an increase in shielding effect. Therefore, it is possible to reduce the influence of crosstalk between adjacent pixels on display.

As shown in FIG. 6, the second interconnect layer has the shielding lines S1 to S3, the data lines D1 to D3, and the reset potential lines R1 to R3 that are formed along the second direction. Here, the shielding line S3 is arranged between two data lines D2 and D3 connected respectively to the pixel circuits 2 and 3 that are adjacent in the first direction. This makes it possible to prevent two data lines from being adjacent to each other so as to reduce crosstalk due to the parasitic capacitance between the data lines, even if the layout of one set of pixel circuits that are adjacent in the first direction is a mirror arrangement.

Further, as shown in FIG. 4 to FIG. 6, the layout of portions of one set of pixel circuits that are adjacent in the first direction and are in contact with their upper layer is also a mirror arrangement, thereby eliminating differences between the pixel circuits, for example, in capacitive coupling between lines. Furthermore, a line that supplies the power potential VEL is arranged in the third interconnect layer, and the line is electrically connected to the source of transistor QP1 via the second interconnect layer and the first interconnect layer. In this way, the third interconnect layer for supplying the power potential VEL is separately provided, thereby making it possible to reduce the influence of noise generated from the first and second interconnect layers on the source potential of the transistors QP1.

The capacitor C shown in FIG. 3 is formed, for example, with an MIM (metal-insulator-metal) structure in which an insulation layer is interposed between metals. In that case, the capacitor C may have a layered structure in which the first electrode of the capacitor C is formed in the third interconnect layer, the second electrode of the capacitor C is formed in the fourth interconnect layer, and the first electrode of the capacitor C is formed in the fifth interconnect layer. The power potential VEL is supplied to the first electrode of the capacitor C formed in the third and fifth interconnect layers.

In this way, the potential of the first electrode of the capacitor C is allowed to be equal to the source potential and the back gate potential of the transistor QP1, thereby making it possible to stably supply the power potential VEL, which is supplied to the first electrode of the capacitor C, also to the source, etc., of the transistor QP1 at low impedance.

The above embodiments have described cases of using P-channel MOS transistors in pixel circuits. However, the invention can be applied also to cases of using N-channel MOS transistors in pixel circuits.

Thus, the invention is not limited to the foregoing embodiments. Many modifications can be made by a person of ordinary skill in the art without departing from the technical scope of the invention.

What is claimed is:

1. A display device, which is an active matrix display device using an organic EL (electroluminescence) panel, comprising:
    a plurality of pixel circuits each including an organic light emitting diode arranged in a pixel region of the organic EL panel and a plurality of transistors configured to drive the organic light emitting diode, the pixel circuits of at least one set of the pixel circuits being adjacent in a first direction;
    a plurality of scanning lines arranged along the first direction in the organic EL panel; and a plurality of data lines arranged along a second direction that is orthogonal to the first direction in the organic EL panel, wherein gate electrodes and impurity diffusion regions of the plurality of transistors have an axisymmetric layout in the at least one set of pixel circuits, gate electrodes of at least one set of transistors that are symmetrically arranged in the at least one set of pixel circuits are integrated, the integrated gate electrodes of the at least one set of transistors that are symmetrically arranged in the at least one set of pixel circuits that are adjacent in the first direction are connected to a single line at one connection point, the connection point being at a center of the gate electrodes, and in the first direction, the integrated gate electrodes form a mirror image about the connection point.

2. The display device according to claim 1, further comprising:

a shielding line arranged between two data lines connected respectively to the one set of pixel circuits that are adjacent in the first direction.

3. An electronic apparatus comprising the display device according to claim 2.

4. The display device according to claim 1, wherein the plurality of pixel circuits each include:

a first transistor configured to supply a current to the organic light emitting diode in accordance with a potential of a capacitor connected to a gate of the first transistor; and a second transistor configured to connect the gate of the first transistor to a single data line in accordance with a potential of a scanning line connected to a gate of the second transistor.

5. The display device according to claim 4, wherein gate electrodes of second transistors of the one set of pixel circuits that are adjacent in the first direction are integrated.

6. An electronic apparatus comprising the display device according to claim 5.

7. The display device according to claim 4, wherein the plurality of pixel circuits each further include:

a third transistor configured to open and close connection between the gate and drain of the first transistor in accordance with a signal supplied to a gate of the third transistor;

a fourth transistor configured to open and close connection between the drain of the first transistor and an anode of the organic light emitting diode in accordance with a signal supplied to a gate of the fourth transistor; and a fifth transistor configured to open and close connection between the anode of the organic light emitting diode and a reset potential line in accordance with a signal supplied to a gate of the fifth transistor.

8. The display device according to claim 7, wherein in first to third pixel circuits of the at least one set of pixel circuits that are adjacent in the first direction, gate electrodes of second transistors of the second and third pixel circuits are integrated, gate electrodes of third transistors of the second and third pixel circuits are integrated, gate electrodes of fourth transistors of the first and second pixel circuits are integrated, and gate electrodes of fifth transistors of the second and third pixel circuits are integrated.

9. An electronic apparatus comprising the display device according to claim 8.

10. An electronic apparatus comprising the display device according to claim 7.

11. The display device according to claim 4, further comprising a shielding line arranged between two lines connected respectively to gate electrodes of first transistors of the one set of pixel circuits that are adjacent in the first direction.

12. An electronic apparatus comprising the display device according to claim 11.

13. An electronic apparatus comprising the display device according to claim 4.

14. An electronic apparatus comprising the display device according to claim 1.

15. A display device, which is an active matrix display device using an organic EL (electroluminescence) panel, comprising:

a plurality of pixel circuits each including an organic light emitting diode arranged in a pixel region of the organic EL panel and a plurality of transistors configured to drive the organic light emitting diode, a first pixel circuit, a second pixel circuit, and a third pixel circuit of the plurality of pixel circuits being consecutively arranged in a first direction;

a plurality of scanning lines arranged along the first direction in the organic EL panel; and a plurality of data lines arranged along a second direction that is orthogonal to the first direction in the organic EL panel, the first pixel circuit and the second pixel circuit being symmetrically arranged about first gate electrodes of at least a first set of transistors of the first pixel circuit and the second pixel circuit, the first gate electrodes being integrated, the integrated first gate electrodes being connected to a single line at a first connection point, the first connection point being at a center of the first gate electrodes, in the first direction, the integrated first gate electrodes forming a mirror image about the first connection point, the second pixel circuit and the third pixel circuit being symmetrically arranged about second gate electrodes of at least a second set of transistors of the second pixel circuit and the third pixel circuit, the second gate electrodes being integrated, the integrated second gate electrodes being connected to a single line at a second connection point, the second connection point being at a center of the second gate electrodes, and in the first direction, the integrated second gate electrodes forming a mirror image about the second connection point.

* * * * *